Figure 1:
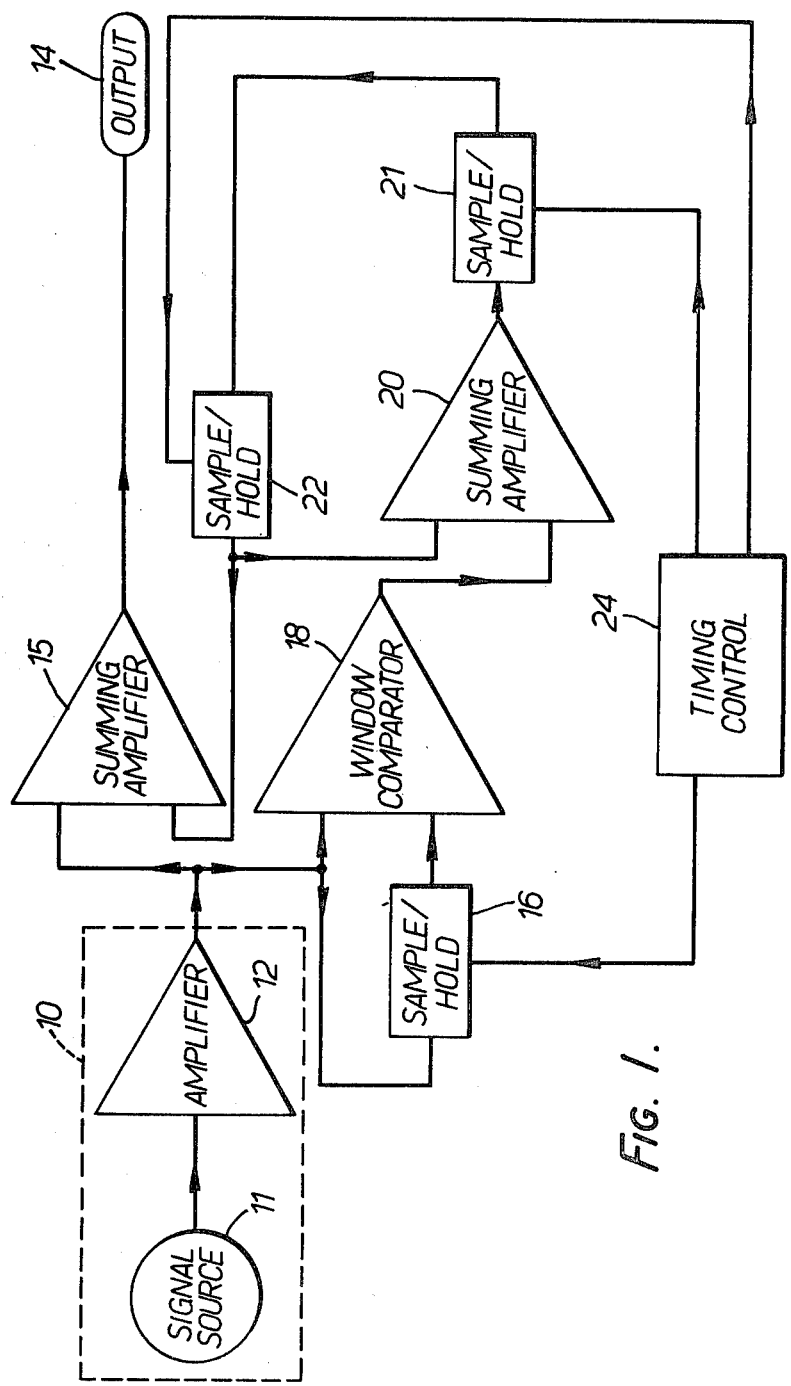

United States Patent [19]

Tucker

[11] Patent Number: 4,463,272
[45] Date of Patent: Jul. 31, 1984

[54] AUTOMATIC DRIFT CORRECTION

[75] Inventor: Brian D. Tucker, Ilford, England

[73] Assignee: Gould Advance Limited, Hainault, England

[21] Appl. No.: 557,375

[22] Filed: Dec. 1, 1983

Related U.S. Application Data

[63] Continuation of Ser. No. 305,774, Sep. 25, 1981.

[30] Foreign Application Priority Data

Sep. 30, 1980 [GB] United Kingdom ............. 8031476

[51] Int. Cl.³ ............................................. H03K 5/24
[52] U.S. Cl. .................................. 307/358; 307/353; 307/517; 328/147; 330/9
[58] Field of Search ............... 307/491, 494, 517, 352, 307/353, 356, 358, 360; 328/132, 135, 147, 150, 151; 330/9, 149

[56] References Cited

U.S. PATENT DOCUMENTS

| | | | |
|---|---|---|---|
| 3,584,309 | 6/1971 | Nicolson | 328/125 X |
| 3,654,560 | 4/1972 | Cath et al. | 307/491 X |
| 3,784,919 | 1/1974 | Azegami | 307/491 X |
| 4,055,777 | 10/1977 | Black | 307/360 |
| 4,297,642 | 10/1981 | Baldwin et al. | 330/9 |
| 4,309,663 | 1/1982 | Bout et al. | 307/352 |

Primary Examiner—Larry N. Anagnos
Assistant Examiner—David R. Hudspeth
Attorney, Agent, or Firm—Laubscher, Philpitt & Laubscher

[57] ABSTRACT

Drift in the zero or datum reference point of a circuit (such as that forming part of a measuring device) is corrected by sensing the rate of change of the signal provided by the circuit and distinguishing between a rate of change characteristic of that due to a valid signal indicative of a measurement and a rate of change characteristic of that due to drift in the circuit.

In one embodiment, a window comparator 18 senses the rate of change of the signal output from circuit 10 by periodically sampling in sample/hold 16 and then comparing with the current value of the signal. A signal circulating path 20, 21, 22 holds a drift compensating value which is updated when comparator 18 senses a rate of change below a threshold value which is indicative of drift in circuit 10. The drift compensating value is added to the signal from circuit 10 in summing amplifier 15 thereby correcting the signal for drift.

9 Claims, 2 Drawing Figures

AUTOMATIC DRIFT CORRECTION

This application is a continuation of application Ser. No. 305,774, filed Sept. 25, 1981.

The present invention relates to a method of automatic drift correction in circuits such as may be found in measuring systems, and is applicable to electrical or electro-mechanical systems having a drift in their zero or datum reference point.

Such drift in a circuit arises, for example, as a result of thermal changes in the components of the circuit, ageing, creep in electro-mechanical transducers, and/or leakages due to changes in humidity or contamination build-up; in consequence of such drift, the output of the circuit may be severely distorted and inaccurate.

The present invention provides a method of automatic drift correction in a circuit, which method senses the rate of change of the output of the circuit and distinguishes between a rate of change characteristic of that due to a signal at the input to the circuit, and a rate of change characteristic of that due to drift in the circuit. A compensating signal may then be applied to negate the effect of the drift.

A circuit arrangement for performing the above method includes means for sensing the rate of change of a signal, and means being responsive to the sensed rate of change not exceeding a selected value to apply a drift compensating value to the signal.

Preferred embodiments of the present invention are based on the fact that in particular apparatus, such as many measuring systems, the signal being processed and/or monitored has known characteristics and the output signal or reading should change by increments greater than a certain quantity at a minimum rate, whereas drift in the output due to the causes mentioned above occurs at a rate which is generally much lower.

The criteria set for rate of change and maximum size of increment to be taken as due to drift will depend on the particular application, but may also be varied within any one application according to prevailing conditions, so as to match the expected response to changes in those conditions.

In one example of such an application, the output signal of an electronic digital to analogue (D/A) converter follows inherently discrete steps, and the steps occur at some maximum rate. If the level of the output is monitored, then any changes of less than, say, ¼ LSB (least significant bit) occurring between one step and the next available step instant must be either a zero/-datum voltage drift, or a drift in the volts per bit scale factor. In the case where the latter is known to be significantly better than the former (which is often the case since stable resistors are readily obtainable but semiconductor devices commonly exhibit changes in offset voltage with temperature), the change in output will be mainly due to zero drift and the performance of the D/A converter can be enhanced by applying a correction for this drift. The correction may be purely digital, or by means of analogue circuits such as sample and hold, or by using digital means to store the correction and applying correction via a subsidiary D/A converter possibly having a shorter scale length and lower accuracy than the main converter.

Another example occurs in an electromechanical transducer system using a load cell, amplifier and A/D converter to weight objects. In this case the criteria for determining that a change in reading is due to zero drift are that the signal change shall be less than or equal to one minimum displayed unit (scale interval) increment in a time period chosen to suit the type of use. That is, for weighing a number of items where each item has a weight greater than the scale interval a short time interval could be chosen, but for weighing items whose weight is less than a scale interval a long time interval is more appropriate.

The circuit may include mechanical filters such as dashpots and/or electrical filters to obtain an average and prevent confusion due to vibration and noise.

The correction may be applied by analogue means before digitisation, or by digital means after digitisation. The digital means may be by discrete logic circuits or by using programmable logic such as programmable logic arrays or a computing device such as a microcomputer. A part-analogue circuit/part-digital circuit method is also possible.

Figure 2:
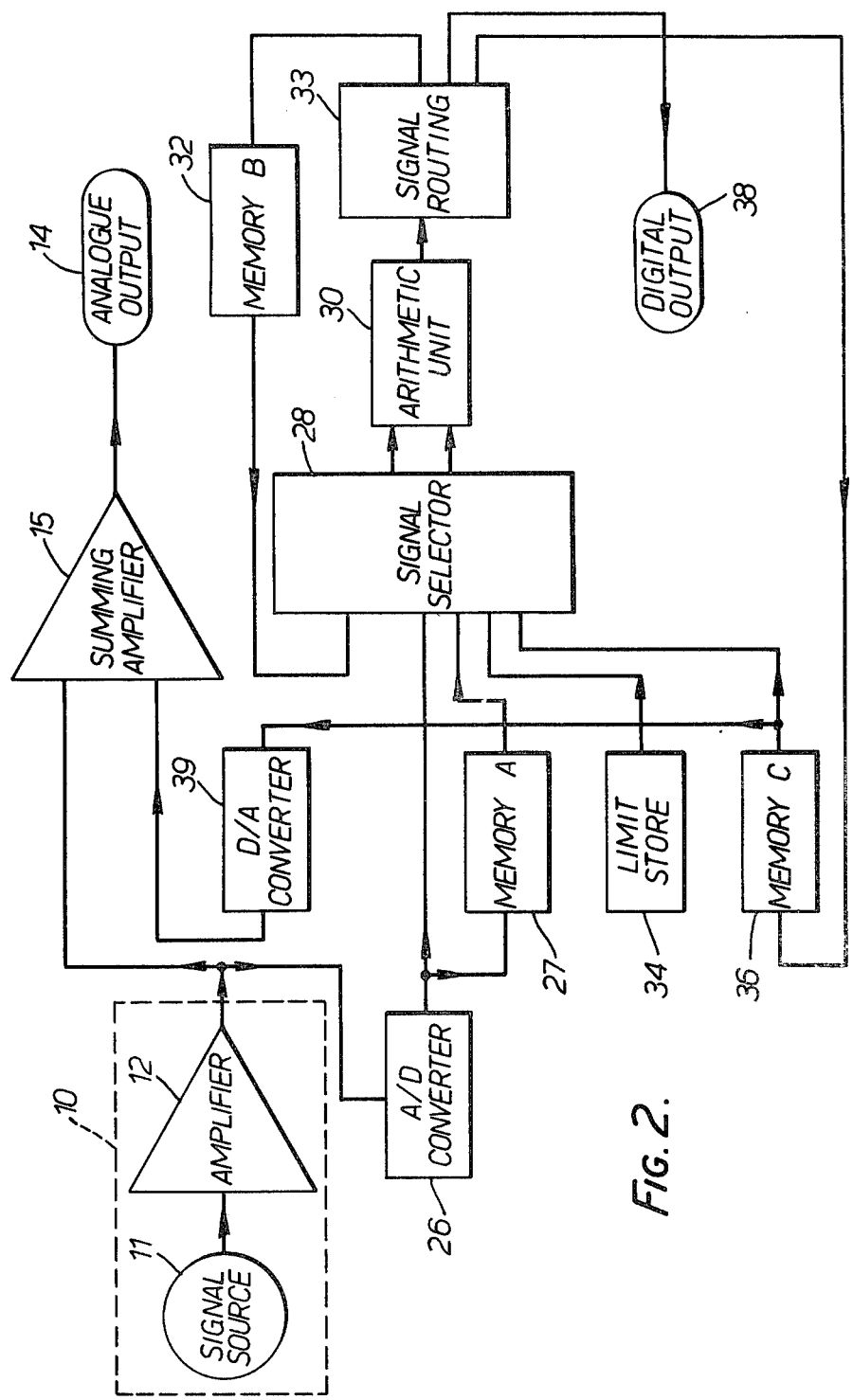

Features and advantages of the present invention will become further apparent from the following description of embodiments thereof, given by way of example, when taken in conjunction with the accompanying drawings, in which:

FIG. 1 shows a block diagram of a circuit in accordance with one embodiment, suitable for analogue implementation; and FIG. 2 shows a block diagram of a circuit in accordance with another embodiment, wherein drift compensation is effected by digital means.

Referring to FIG. 1, a circuit 10 assumed to be susceptible to drift includes a signal source 11 and amplifier 12 for amplifying the output of the signal source 11. The signal source may be any device providing a comparatively low-level signal requiring amplification before further processing, such as the aforementioned electro-mechanical weighing transducer. The output of the amplifier 12 would normally be fed to an output device 14, such as a meter, display or pen-recorder, which output device would show an inaccurate reading in the presence of drift in the circuit 10.

In the present instance, the output of the amplifier 12 is fed to the output device 14 via a summing amplifier 15, and a drift compensating signal is applied to another input of the summing amplifier so as to correct the signal fed to the output device 14, as described hereinafter.

The output from the amplifier 12 is additionally fed to a sample/hold circuit 16 and to one input of a window comparator 18. The output of the sample/hold circuit 16 is fed to another input of the window comparator 18, whose output is fed to a second summing amplifier 20. The output of the summing amplifier 20 is fed via second and third sample/hold circuits 21, 22 respectively, both to the drift compensating input of summing amplifier 15, and to the other input of the second summing amplifier 20. A timing control circuit 24 provides timing signals for the sample/hold circuits 16, 21 and 22.

In operation, the output of the amplifier 12 is stored in sample/hold circuit 16 in response to a timing signal from timing control 24. This sampled value is compared with the actual instantaneous output from the amplifier 12 in window comparator 18. If the comparison between the output of the amplifier 12 and the sample/hold 16 output provides a value which falls outside the threshold window set by the comparator 18, no output is produced by the comparator. If however the compared value is within the threshold window, a corresponding signal is fed to the summing amplifier 20. The threshold window is set to provide a maximum rate of change which can be identified as drift, rates of change above this maximum being considered as valid signals. It will be seen that this maximum rate of change is equal to the window of the comparator divided by the time interval between timing signals delivered to sample/hold circuit 16 by the timing control circuit 24. Thus the output of the amplifier 12 at a first instant of time is compared (having been held in sample/hold circuit 16) with the output at a second instant of time.

The arrangement of summing amplifier 20 and sample/hold circuits 21, 22 provides a circulating path for storing the error or compensating signal to be applied to the drift compensating input of summing amplifier 15. Timing signals from the timing control circuit 24 are applied in such a way that this compensating signal is alternately transferred from sample/hold 22 via summing amplifier 20 to sample/hold 21, and then back to sample/hold 22. Any drift updating value derived from the window comparator 18 can be added to the compensating signal as it passes through summing amplifier 20, and the updated compensating signal will then be applied to summing amplifier 15 after passing through sample/hold circuits 21 and 22 in turn.

Thus assuming that the circuit 10 starts with no drift, the circulating compensating signal will be zero at this time, and the reading on output device 14 will be that provided by the amplifier 12. Any drift arising after this time will be first identified as such by the window comparator 18, and then added to the signal already stored by sample/hold 22, from which it will be applied to the drift compensating input of summing amplifier 15 modifying the output thereof to take account of the drift. Any valid signal, i.e. one whose rate of change is rejected by window comparator 18, will however pass unobstructed to provide a valid reading on the output device 14.

FIG. 2 shows an arrangement wherein the circuit 10 is associated with a digital drift compensating system. The principle of operation is similar to that of the analogue arrangement of FIG. 1, and also includes the summing amplifier 15 and analogue output device 14. However, the output of amplifier 12 is first fed to an A/D converter 26, whose digitised output is fed to a memory 'A' 27 and to a signal selector circuit 28. Memory 'A' 27 also has an output to the signal selector circuit 28, and the arrangement is that the output of A/D converter 26 is stored in memory 'A' 27. After a suitable time, the value stored in the memory is compared with the current A/D converter 26 output by an arithmetic unit 30 (via the signal selector circuit 28), the result of the comparison being stored in a memory 'B' 32, after passing through a signal routing device 33. The contents of the memory 'B' are then compared with preset limits set in a limit store 34, the signals again passing through the signal selector circuit 28, and if within the limits, are added to an offset store, memory 'C' 36.

The contents of memory 'C' 36 can then be added to the current output of the A/D converter 26 (via the signal selector 28 and in the arithmetic unit 30) so as to provide an output to a digital output device 38. In this case, summing amplifier 15 and analogue output device 14 are not necessary.

Alternatively, the contents of memory 'C' 36, which constitute the drift compensating signal in digital form, can be fed via a D/A converter 39 to provide an analogue signal at the drift compensating input of summing amplifier 15 so as to modify the original analogue signal from circuit 10, and correct for drift in the analogue output device 14.

It will be seen that in the case of the FIG. 2 arrangement, the memory 'C' 36 holds the drift compensating signal which is periodically updated depending on the comparison between the preset limits in the limit store 35 and the contents of memory 'B' 32 which contents are indicative of the rate of change of the output of circuit 10. The preset limits in the limit store 34 are accordingly set in accordance with the criteria set out above, depending on the particular application.

I claim:

1. An automatic drift correction circuit comprising means for sensing the time rate of change of an input signal and for comparing the sensed rate of change with a threshold value, and means for applying a drift compensating value to the input signal when the sensed rate of change is less than the threshold value.

2. An automatic drift correction circuit as claimed in claim 1, wherein the means for applying a drift compensating value comprises a signal circulating path including a first summing circuit for periodically updating the drift compensating value from the comparing means, and a second summing circuit for combining the updated drift compensating value to the input signal thereby to provide an output signal compensated for drift.

3. An automatic drift correction circuit as claimed in claim 2, wherein the comparing means comprises a sampling circuit periodically sampling the input signal and a window comparator responsive to the difference between values of the input signal sampled at different times being within a threshold window to provide the drift compensating value to the first summing means.

4. An automatic drift correction circuit as claimed in claim 3, wherein the comparator compares the instantaneous value of the input signal with one sampled at an earlier time.

5. An automatic drift correction circuit as claimed in claim 2, wherein the signal circulating path further comprises first and second sample/hold circuits alternately responsive to a timing control circuit whereby initially the output of the first sample/hold circuit is transferred to the second sample/hold circuit and thence to one input of the first summing circuit, and subsequently the output of the first summing circuit is transferred to the first sample/hold circuit.

6. An automatic drift correction circuit as claimed in claim 2, including an arithmetic unit which constitutes the comparing means and the first summing circuit, and a first memory arranged to periodically store a value of the input signal, the arithmetic unit comparing values of the input signal sensed at different times.

7. An automatic drift correction circuit as claimed in claim 6, further including a second memory storing the result of the comparison of values of input signal by the arithmetic unit.

8. An automatic drift correction circuit as claimed in claim 7, further including a third memory storing the drift compensated value and being updated by the second memory when the comparison result in the second memory is within the limits set by a limit store.

9. A method of automatic drift correction in a circuit providing a signal whose time rate of change when below a threshold value is indicative of drift, comprising sensing the time rate of change of the signal, comparing the sensed time rate of change with a threshold value, and applying a drift compensating value to the signal.

* * * * *